United States Patent [19]

Tustaniwskyj et al.

[11] Patent Number: 4,879,629
[45] Date of Patent: Nov. 7, 1989

[54] LIQUID COOLED MULTI-CHIP INTEGRATED CIRCUIT MODULE INCORPORATING A SEAMLESS COMPLIANT MEMBER FOR LEAKPROOF OPERATION

[75] Inventors: Jerry I. Tustaniwskyj, Mission Viejo; Kyle G. Halkola, San Diego, both of Calif.

[73] Assignee: Unisys Corporation, Blue Bell, Pa.

[21] Appl. No.: 264,749

[22] Filed: Oct. 31, 1988

[51] Int. Cl.[4] .................... H01L 23/36; H01L 23/40
[52] U.S. Cl. .................................................. 361/385
[58] Field of Search .............. 361/385, 384, 383, 382; 357/82, 75; 165/83, 81

[56] References Cited

U.S. PATENT DOCUMENTS 4,138,692  2/1979  Meeker et al. ..................... 357/75
4,381,032  4/1983  Cutchaw ............................. 361/385

Primary Examiner—Roy N. Envall Jr.
Attorney, Agent, or Firm—Charles J. Fassbender; Robert S. Bramson

[57] ABSTRACT

A liquid cooled integrated circuit module includes a substrate, a plurality of chips mounted on the substrate, and electrical conductors integrated into the substrate to interconnect the chips. A compliant member which is completely seamless overlies all of the chips. This seamless compliant member is hermetically sealed at its perimeter to the substrate around all of the chips. Between this seamless compliant member and the chips are thermally conductive studs, and they carry heat by conduction from the chips to the compliant member. A rigid cover overlies the compliant member, and it is attached to the substrate at its perimeter. Within the cover are several parallel spaced apart ribs which project towards and press against the compliant member between the chips, and they form channels for a liquid coolant which carries heat away from the compliant member.

8 Claims, 4 Drawing Sheets

LIQUID COOLED MULTI-CHIP INTEGRATED CIRCUIT MODULE INCORPORATING A SEAMLESS COMPLIANT MEMBER FOR LEAKPROOF OPERATION

BACKGROUND OF THE INVENTION

This invention relates to multi-chip liquid cooled integrated circuit modules. Two U.S. Pats. which are representative of the prior art on these modules are 4,138,692 to Meeker et al and 4,561,040 to Eastman et al.

In both of the above patents, a substrate is provided on which several integrated circuit chips are mounted, and patterned conductors in the substrate electrically interconnect the chips. Also, a liquid cooling apparatus is provided which transfers heat from the chips. However, the present inventors have analyzed this cooling apparatus and have discovered that it ha certain deficiencies.

In particular, in both of the patents '692 and '040, separate hollow bellows-shaped tubes carry a liquid coolant to and from each of the chips. Each of these bellows-shaped tubes has one end which is attached to a solid thermally conductive end plate which makes contact with a chip, and it has an opposite end that attaches to a manifold which is the source of the liquid coolant.

However, due to the presence of these bellows-shaped tubes, the above cooling apparatus has a large number of seams. Two seams occur at each bellows. And, if just one of those seams develops a leak, it will cause the chips to malfunction.

In FIG. 2 of Pat. '692, each of the bellows is indicated by reference numeral 21. One end of each bellows 21 is joined to a stud 22B, while the opposite end of each bellows 21 is joined to a plate 16B which is part of a manifold that supplies the liquid coolant. If the seam at either end of any one of these bellows 21 has a leak, then all of the chips 10 in the entire module will be submerged in the liquid coolant.

Such submersion will short the terminals of all of the chips together if the coolant is electrically conductive. In that case, the malfunction would be quick and catastrophic. Further, even if the liquid coolant is non-conductive, it will expose the chips to various contaminants. These contaminants would be washed to the chips from anywhere in the entire cooling system, such as from solder material at the leaky joint, and they would cause long term reliability problems.

These same problems occur in the cooling apparatus of Pat. '040. See, for example, FIG. 1 in which the bellows-shaped tubes are indicated by reference numeral 32. Reference numeral 32A indicates a flange on one end of the bellows 32 which makes a seam with a cooling plate 24. Each bellows 32 also makes a seam at its opposite end as can be seen from FIG. 4.

Making these seams leakproof is a tedious and costly task which is not well suited for a mass production environment. Further, these manufacturing problems become worse as the number of bellows per module increases, and as the size of the bellows decreases.

Accordingly, a primary object of the invention is to provide a multi-chip liquid cooling module in which all of the above problems are overcome.

BRIEF SUMMARY OF THE INVENTION

In accordance with the invention, a liquid cooled integrated circuit module includes a substrate and a plurality of chips mounted on the substrate. Electrical conductors are integrated into the substrate to interconnect the chips.

Also, the module includes a compliant member which is completely seamless and which overlies all of the chips. This seamless compliant member is hermetically sealed at its perimeter to the substrate around all of the chips. Between this seamless compliant member and the chips are thermally conductive studs, and they carry heat by conduction from the chips to the compliant member.

Further included in the module is a rigid cover which overlies the compliant member, and it is attached to the substrate at its perimeter. Within the cover are several parallel spaced apart ribs. These ribs project towards and press against the compliant member in the spaces between the chips, and they form channels for a liquid coolant which carries heat away from the compliant member.

BRIEF DESCRIPTION OF THE DRAWINGS

Various features and advantages of the invention are described herein in detail in conjunction with the accompanying drawings wherein.

DETAILED DESCRIPTION OF THE INVENTION

Figure 1:
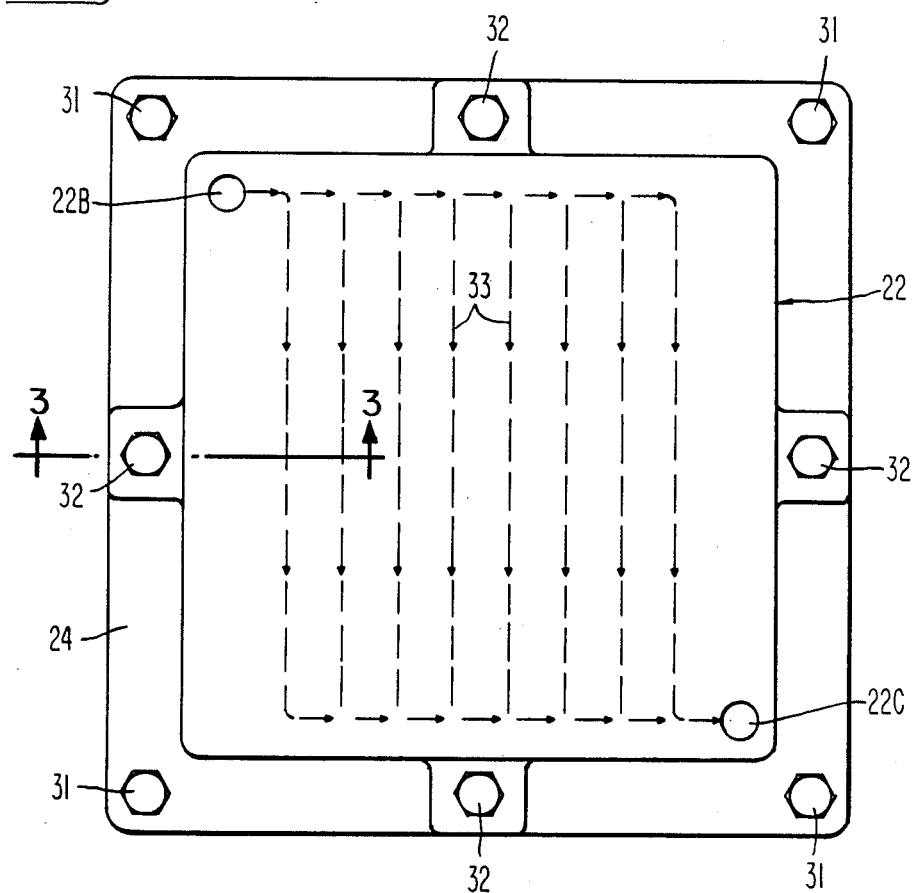
FIG. 1 is a top view of the exterior of a liquid cooled integrated circuit module which is constructed according to the invention.
Figure 2:
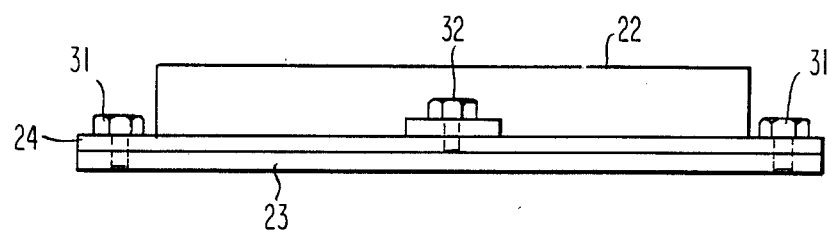
FIG. 2 is a side view of the exterior of the FIG. 1 module.
Figure 3:
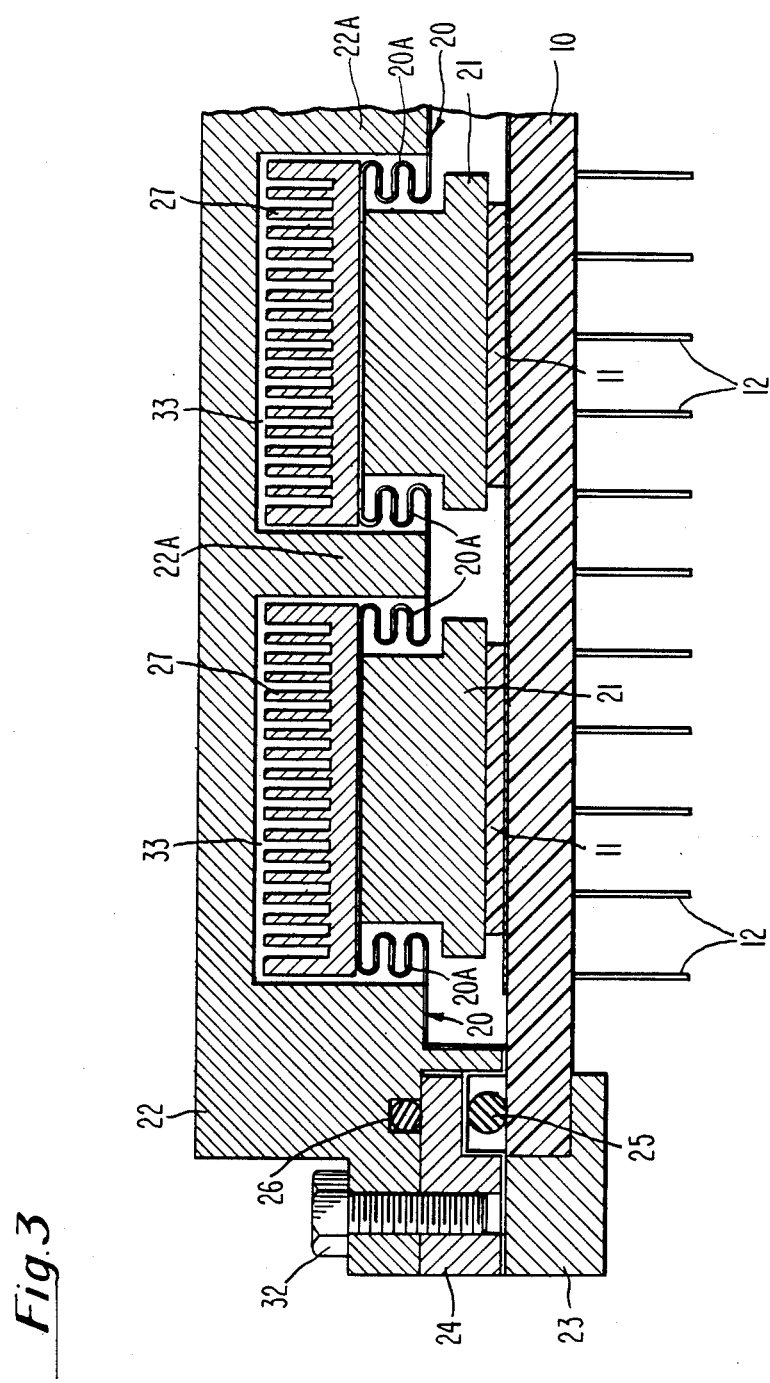
FIG. 3 is an enlarged sectional view of a portion of the FIG. 1 module.

Referring now to FIGS. 1, 2 and 3, a preferred embodiment of a liquid cooled integrated circuit module which is constructed in accordance with the invention will be described in detail. This embodiment of the module is shown by an exterior top view in FIG. 1, and it is shown by an exterior side view in FIG. 2, and it is shown from the interior via an enlarged sectional view in FIG. 3.

As can be seen in FIG. 3, the module includes a substrate 10 on which a plurality of integrated circuit chips 11 are disposed in a spaced apart fashion. These chips 11 are electrically interconnected by electrical conductors 12 which are integrated into the substrate 10 and which extend from the substrate so that signals may be sent to and received from the chips. Substrate 10, along with the chips 11 and the conductors 12, exist in the prior art but without any of the remaining components of FIGS. 1-3.

Those remaining components include a compliant member 20, a plurality of thermally conductive studs 21, a rigid cover 22, a pair of seal rings 23 and 24, a pair of gaskets 25 and 26, and a plurality of heat sinks 27. All of these components 20–27 are interconnected as shown in FIGS. 1 thru 3; and they operate to cool the chips 11 and to protect them from contamination.

Compliant member 20 is completely seamless, and it has a uniform thickness and uniform composition. Also, the compliant member 20 overlies all of the chips 11, and it is held in place at its perimeter by the seal rings 2 and 24. Several screws 31 go through the seal rings 23 and 24 to hold components 10, 20, 23, 24 and 25 together. Thus, a hermetic chamber is formed between the compliant member 20 and substrate 10 which encloses the chips 11 an protects them from contamination.

Lying between the compliant member 20 and the chips 11 are the thermally conductive studs 21. These studs 21 are soldered or brazed to the compliant member 20, and they operate to transfer heat by conduction from the chips 11 to the compliant member 20. Also, the studs 21 operate to give the compliant member 20 room to expand and contract perpendicular to the surface of substrate 10. That expansion and contraction occurs in a plurality of pleated regions 20A in the flexible member, each of which surrounds a stud. This expansion and contraction compensates for height and angle variances among the chips 20 which occur due to various manufacturing tolerances.

For example, the flatness of substrate 10 will inherently have a certain manufacturing tolerance which, as an example, may be plus or minus 2 mils per inch. Also, the precision with which the chips 11 can be mounted even on a perfectly flat substrate will have a certain manufacturing tolerance, such as plus or minus 1 mil. Thus, the top surfaces of the chips 11 that make contact with the studs 21 will be at different heights and different angles relative to one another; and, it is the pleated regions 20A which compensate for those variations. Overlying the compliant member 20 is the rigid cover 22. Its perimeter, and gasket 26 and the perimeter of seal ring 24 are held together with screws 32. Cover 22 also has several parallel spaced apart ribs 22A which project toward the substrate. These ribs 22A push against the compliant member 20 in the spaces between the studs 21. Thus, the ribs 22A hold the compliant member 20 tightly against the top of the studs 21 by pushing and expanding the pleated regions 20A over the studs 21.

Also, the cover 22 together with compliant member 20 form several channels 33 for a liquid coolant. These channels 33 are aligned with the studs 21, and they house the heat sinks 27. Liquid enters the channels 33 through an input port 22B in cover 22; then it passes in the channels 33 past the heat sinks 27 to remove heat from them; and then it exits through an output port 22C.

Figure 4:
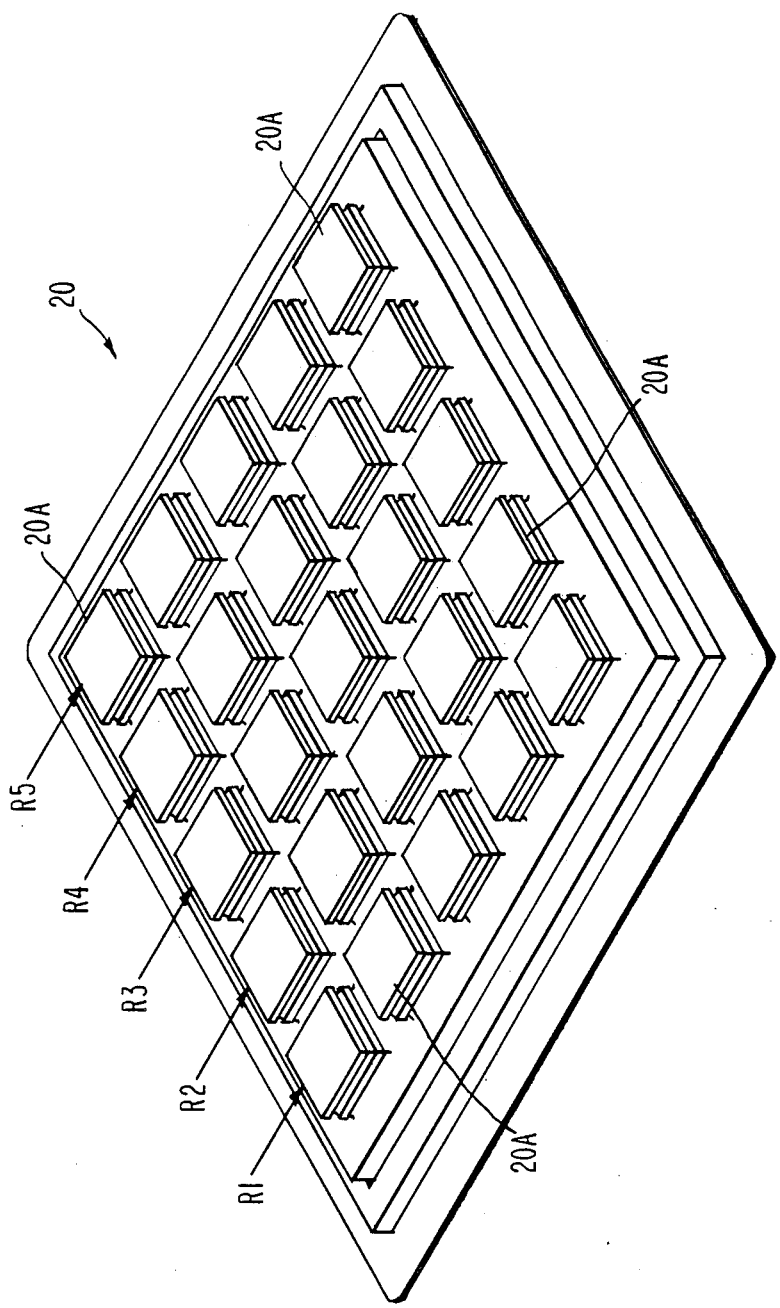
FIG. 4 is a pictorial view of a compliant member which is a key component in the FIG. 1 module.

Turning now to FIG. 4, it shows additional details of the compliant member 20. In FIG. 4, the pleated regions 20A are arranged in an array of five rows, R1 thru R5, and there are five pleated regions in each row. A corresponding cover 22 for this compliant member has ribs 22A which lie between the rows, and those ribs form the sidewalls of the channels for the liquid coolant. Any danger of the coolant leaking into the hermetic cavity which contains the chips 11 (and thereby shorting or contaminating the chips) is eliminated since the compliant member 20 has no seams through which the coolant can leak.

Figure 5A:
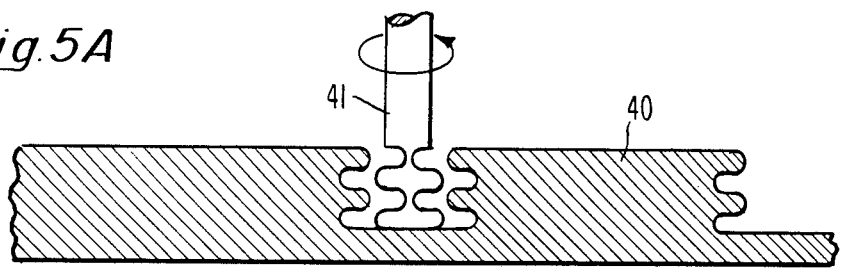
FIGS. 5A, 5B, and 5C illustrate the steps of a process for forming the FIG. 4 compliant member.
Figure 5B:
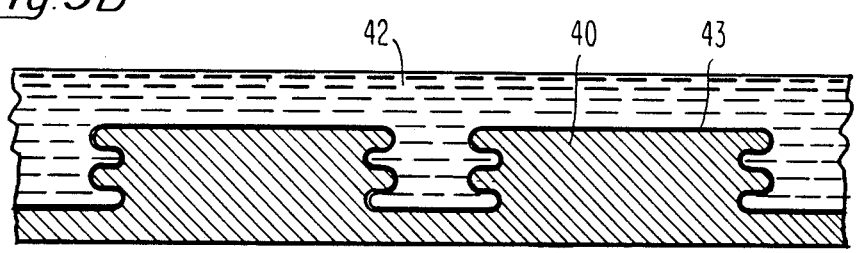
Figure 5C:
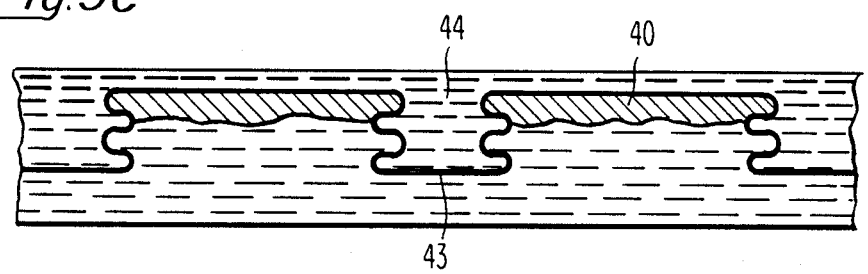

Next, considering FIGS. 5A, 5B and 5C, it shows a preferred process by which the compliant member 20 is fabricated. To begin, as shown in FIG. 5A, a mandrel 40 for the compliant member 20 is machined from a bare piece of metal, such as aluminum. In FIG. 5A, reference number 41 indicates a rotating grinding wheel whose profile has the same shape as the pleats in member 20. This grinding wheel is positioned up and down and left and right, as it is rotating, to give the surface of the mandrel the same shape as member 20.

After the mandrel 40 is formed, it is placed in an electrolytic or an electroless plating solution 42, as is shown in FIG. 5B. This step forms a thin layer of metal 43 on the surface of the mandrel 40. Preferably, layer 43 is plated until it is ½-10 mils thick. One suitable material for layer 43 is nickel.

Thereafter, the mandrel 40 and layer 43 are placed in an acid solution 44, as is shown in FIG. 5C. This acid solution 44 is chosen such that it etches the material of which the mandrel 40 is made but does not etch the layer 43. Consequently, all of the mandrel 40 will etch away, and the layer 43 will remain as a shaped foil. This remaining foil 43 is the FIG. 4 compliant member 20.

A preferred embodiment of the invention has now been described in detail. In addition, however, many changes and modifications can be made to this embodiment without departing from the nature and spirit of the invention. For example, the pleated regions 20A in the compliant member 20 can be arranged in various numbers of rows, and there can be various numbers of pleated regions in each row. Typically, member 20 will have two to twenty rows of pleated regions, and two to twenty pleated regions per row.

As another alternative, each of the pleated regions 20A can be enlarged such that it covers more than one chip. For example, a pleated region can be made rectangular such that it covers two chips per row, or it can be enlarged such that it covers a square shaped pattern of four chips. Such modification would reduce the amount of machining that is required in the step of FIG. 5A, but these modified pleated regions would be able to accommodate less variations in the height and angular orientation among the chips 11.

As still another variation, the profile of the pleats in the regions 20A could be changed, or their number could be increased or decreased. Such a modification would be achieved simply by changing the shape of the grinder 41 in FIG. 5A. For example, each pleated region could have just one pleat, and its profile could be less zigzagged than illustrated.

Further, in modules where the chip density is small, (i.e. where the spacing between chips is large), the pleats in member 20 could actually be eliminated. In such a module, compliancy in member 20 to compensate for small degrees of height and angle variations in the chip 11 would be achieved by making member 20 of a ductile metal, such as aluminum or beryllium copper, and thin enough to be stretched slightly by the ribs 22A.

Also, in modules having very high power chips, springs could be incorporated into the heat sinks which push the heat sinks down and squeeze the studs against the top of the underlying chip 11. In such modules, a thermally conductive grease could also be added between the chips 11 and the studs 21.

Figure 6:
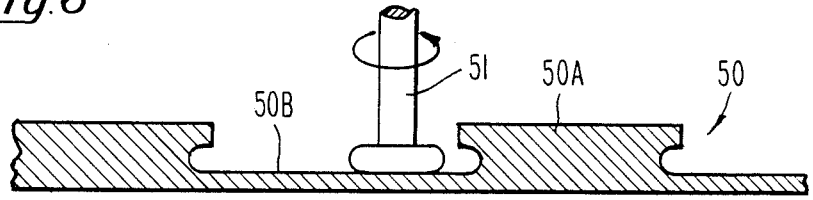
FIG. 6 illustrates a process for forming an alternative embodiment of the compliant member.

As still another alternative, the studs 21 can be integrated into the flexible member 20. This embodiment of member 20 is illustrated in FIG. 6 wherein a single piece of metal 50 is machined by a rotating grinding wheel 51 such that it has thick regions 50A which are spaced apart and connected by thin regions 50B. In the completed module, each region 50A would contact a chip 11. This embodiment of member 20 has no pleats, and thus it is best suited for use in modules which have a low chip density.

Accordingly, it is to be understood that the invention is not limited to the illustrated embodiment bu is defined by the appended claims.

What is claimed is:

1. A liquid cooled integrated circuit module that includes a substrate having a major surface, a plurality of integrated circuit chips which are spaced apart on said substrate surface in a non-coplanar fashion, a single seamless compliant member that covers all of said chips and is attached to said substrate, thermally conductive studs which lie between said seamless member and said chips and which conduct heat therebetween, and a rigid cover over said seamless compliant member which forms channels for a liquid coolant and which attaches to said substrate such that said compliant member and said studs and said chips are squeezed together; wherein to compensate for said non-coplanarity and accommodate a small spacing between chips, said seamless compliant member has pleated regions with each such region having pleats which run zigzagged alongside of said studs perpendicular to said substrate surface.

2. A module according to claim 1 wherein portions of said studs are indented and said pleats are run alongside of said indented stud portions.

3. A module according to claim 1 wherein said cover has spaced apart ribs which project toward said substrate and push against said seamless compliant member between said chips.

4. A module according to claim 1 wherein said module further includes heat sinks between said compliant member and said cover which are aligned with said chips and wherein springs push said heat sinks against said cover.

5. A module according to claim 1 wherein said pleats encompass a region of said compliant member beneath which are more than one chip.

6. A module according to claim 2 wherein said cover has spaced apart ribs which project toward said substrate and push against said seamless compliant member between said chips.

7. A module according to claim 2 wherein said module further includes heat sinks between said compliant member and said cover which are aligned with said chips and wherein springs push said heat sinks against said cover.

8. A module according to claim 2 wherein said pleats encompass a region of said compliant member beneath which are more than one chip.

* * * * *